(12) United States Patent
Kawanishi et al.

(10) Patent No.: US 12,255,072 B2
(45) Date of Patent: Mar. 18, 2025

(54) METHOD OF PROCESSING SUBSTRATE, SUBSTRATE PROCESSING APPARATUS, RECORDING MEDIUM, AND METHOD OF MANUFACTURING SEMICONDUCTOR DEVICE

(71) Applicant: KOKUSAI ELECTRIC CORPORATION, Tokyo (JP)

(72) Inventors: Masato Kawanishi, Toyama (JP); Takumi Ito, Toyama (JP); Kimihiko Nakatani, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 173 days.

(21) Appl. No.: 17/826,332

(22) Filed: May 27, 2022

(65) Prior Publication Data

US 2022/0415659 A1  Dec. 29, 2022

(30) Foreign Application Priority Data

Jun. 29, 2021 (JP) .................................. 2021-107284

(51) Int. Cl.
*H01L 21/3065* (2006.01)
*H01L 21/67* (2006.01)

(52) U.S. Cl.
CPC .... *H01L 21/3065* (2013.01); *H01L 21/67069* (2013.01)

(58) Field of Classification Search
CPC ........... H01L 21/3065; H01L 21/67069; H01L 21/32135; H01L 21/30604; H01L 21/32055

See application file for complete search history.

(56) References Cited

U.S. PATENT DOCUMENTS

| | | | |
|---|---|---|---|
| 4,844,774 A | 7/1989 | Sekine et al. | |
| 4,985,114 A | 1/1991 | Okudaira et al. | |
| 5,130,162 A * | 7/1992 | Ogawa ..................... | G11B 7/26 427/407.1 |
| 5,635,021 A | 6/1997 | Harafuji | |

(Continued)

FOREIGN PATENT DOCUMENTS

| | | |
|---|---|---|
| CN | 111243948 A | 6/2020 |
| EP | 0204538 A2 | 6/1986 |

(Continued)

OTHER PUBLICATIONS

European Search Report issued on Dec. 8, 2022 for European Patent Application No. 22175744.6.

(Continued)

*Primary Examiner* — Duy Vu N Deo
*Assistant Examiner* — Christopher Remavege
(74) *Attorney, Agent, or Firm* — Volpe Koenig

(57) ABSTRACT

There is provided a technique that includes: (a) supplying a first gas containing a group XIV element to a substrate on which a film containing the group XIV element is formed such that reaction by-products generated by reaction with the group XIV element contained in the film formed on the substrate are saturated and adsorbed on the substrate; (b) supplying a second gas containing a halogen after (a); and (c) etching the film containing the group XIV element formed on the substrate by alternately repeating (a) and (b).

20 Claims, 9 Drawing Sheets

(56) References Cited

U.S. PATENT DOCUMENTS

| | | | | |
|---|---|---|---|---|
| 5,868,833 | A | * | 2/1999 | Habuka .................... C30B 25/02 117/84 |
| 9,425,041 | B2 | * | 8/2016 | Berry, III ............ H01L 21/0274 |
| 10,529,560 | B2 | * | 1/2020 | Miyakura ......... H01L 21/30604 |
| 2002/0022347 | A1 | | 2/2002 | Park et al. |
| 2005/0279997 | A1 | * | 12/2005 | Shin .................. H01L 21/02529 438/300 |
| 2008/0135516 | A1 | | 6/2008 | Yokogawa et al. |
| 2008/0233038 | A1 | * | 9/2008 | Hayashida ............ C01B 33/033 423/350 |
| 2012/0028462 | A1 | * | 2/2012 | Kojima ............. C23C 16/45557 438/653 |
| 2014/0017898 | A1 | | 1/2014 | Nemani et al. |
| 2016/0133530 | A1 | | 5/2016 | Sonoda et al. |
| 2016/0141173 | A1 | * | 5/2016 | Moriya ............. H01L 21/02513 438/479 |
| 2016/0293398 | A1 | * | 10/2016 | Danek ............... H01L 21/02211 |
| 2017/0229314 | A1 | | 8/2017 | Tan et al. |
| 2018/0277364 | A1 | * | 9/2018 | Miyakura ......... H01L 21/02532 |
| 2019/0267230 | A1 | * | 8/2019 | Harada ............. C23C 16/45546 |
| 2019/0279877 | A1 | * | 9/2019 | Murakami ......... C23C 16/4584 |
| 2019/0362984 | A1 | | 11/2019 | Katsunuma |
| 2021/0159088 | A1 | | 5/2021 | Degai et al. |

FOREIGN PATENT DOCUMENTS

| | | |
|---|---|---|
| JP | 02-105413 A | 4/1990 |
| JP | 08-195385 A | 7/1996 |
| JP | 2005-183514 A | 7/2005 |
| JP | 2008-124181 A | 5/2008 |
| JP | 2015-523734 A | 8/2015 |
| JP | 2016-092342 A | 5/2016 |
| JP | 2019-207911 A | 12/2019 |
| KR | 2017-0093080 A | 8/2017 |
| KR | 2021-0063249 A | 6/2021 |

OTHER PUBLICATIONS

Korean Office Action issued on May 15, 2023 for Korean Patent Application No. 10-2022-0065314.

Singapore Search Report issued on Oct. 21, 2024 for Singapore Patent Application No. 10202250029G.

Singapore Written Opinion issued on Oct. 21, 2024 for Singapore Patent Application No. 10202250029G.

* cited by examiner

METHOD OF PROCESSING SUBSTRATE, SUBSTRATE PROCESSING APPARATUS, RECORDING MEDIUM, AND METHOD OF MANUFACTURING SEMICONDUCTOR DEVICE

CROSS-REFERENCE TO RELATED APPLICATION

This application is based upon and claims the benefit of priority from Japanese Patent Application No. 2021-107284, filed on Jun. 29, 2021, the entire contents of which are incorporated herein by reference.

TECHNICAL FIELD

The present disclosure relates to a method of processing a substrate, a substrate processing apparatus, a recording medium, and a method of manufacturing a semiconductor device.

BACKGROUND

There is a case that a precursor gas including a silane-based gas, a chlorine-based or fluorine-based gas, and a hydrogen-based gas are sequentially and repeatedly supplied a plurality of times to a substrate with a silicon layer exposed to grow a film on the silicon layer.

SUMMARY

Some embodiments of the present disclosure provide a technique capable of enhancing the controllability of etching.

According to one embodiment of the present disclosure, there is provided a technique that includes: (a) supplying a first gas containing a group XIV element to a substrate on which a film containing the group XIV element is formed such that reaction by-products generated by reaction with the group XIV element contained in the film formed on the substrate are saturated and adsorbed on the substrate; (b) supplying a second gas containing a halogen after (a); and (c) etching the film containing the group XIV element formed on the substrate by alternately repeating (a) and (b).

BRIEF DESCRIPTION OF DRAWINGS

The accompanying drawings, which are incorporated in and constitute a part of the specification, illustrate embodiments of the present disclosure.

DETAILED DESCRIPTION

Figure 1:
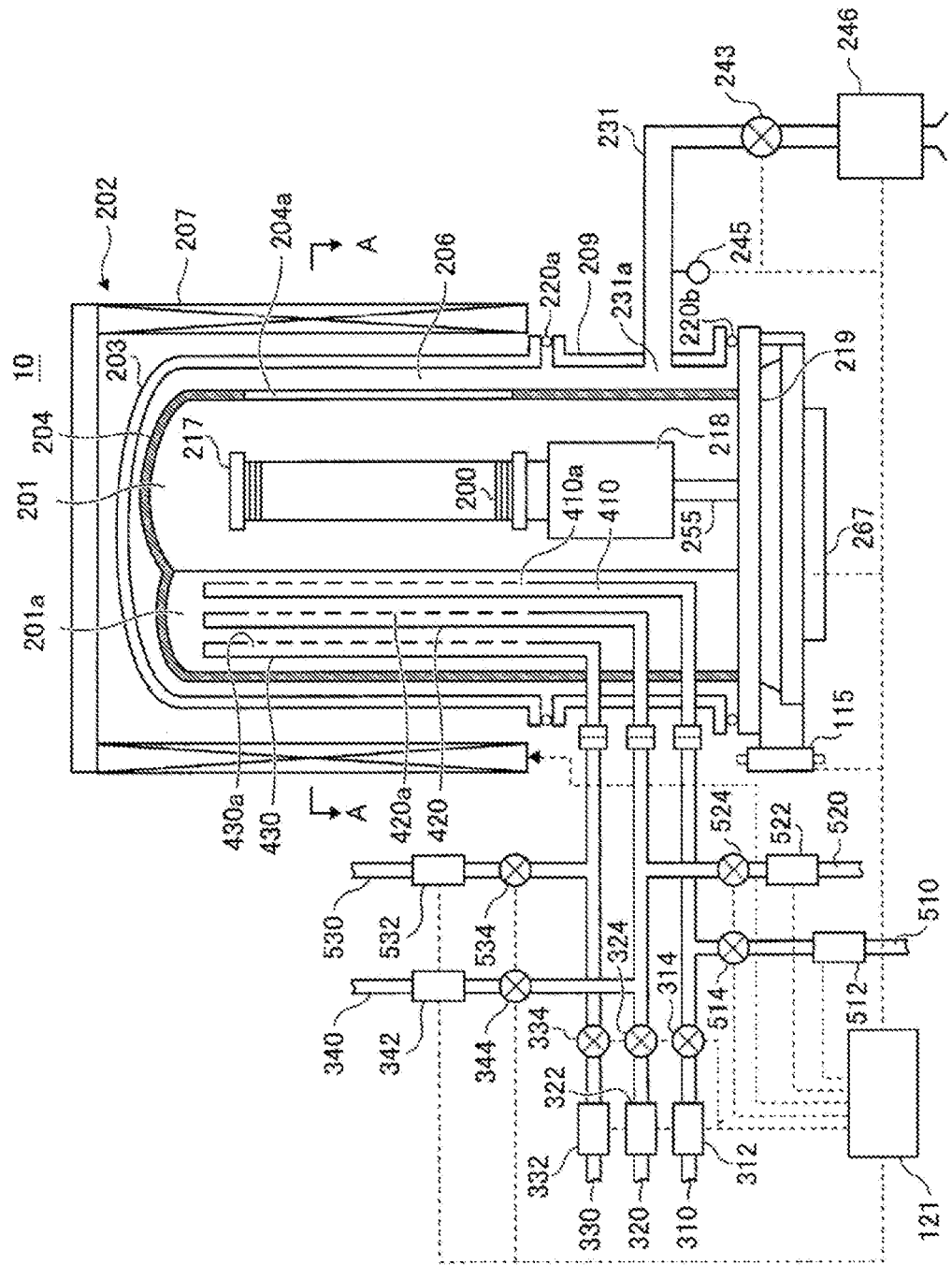
FIG. 1 is a vertical sectional view showing an outline of a vertical process furnace of a substrate processing apparatus according to embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or some embodiments of the present disclosure will now be described with reference to FIGS. 1 to 5D. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

A substrate process apparatus 10 includes a process furnace 202 in which a heater 207 as a heating means (a heating mechanism or a heating system) is provided. The heater 207 has a cylindrical shape and is vertically installed by being supported on a heater base (not shown) as a holding plate.

An outer tube 203, which constitutes a process container, is disposed inside the heater 207 to be concentric with the heater 207. The outer tube 203 is made of, for example, a heat resistant material such as quartz ($SiO_2$) or silicon carbide (SiC), and is formed in a cylindrical shape with its upper end closed and its lower end opened. A manifold (inlet flange) 209 is disposed below the outer tube 203 to be concentric with the outer tube 203. The manifold 209 is made of, for example, a metal material such as stainless steel (SUS), and is formed in a cylindrical shape with its upper and lower ends opened. An O-ring 220a serving as a seal member is installed between the upper end portion of the manifold 209 and the outer tube 203. As the manifold 209 is supported by the heater base, the outer tube 203 becomes a state that is vertically installed.

An inner tube 204 constituting the process container is disposed inside the outer tube 203. The inner tube 204 is made of, for example, a heat resistant material such as quartz ($SiO_2$) or silicon carbide (SiC), and is formed in a cylindrical shape with it upper end closed and its lower end opened. The process container mainly includes the outer tube 203, the inner tube 204, and the manifold 209. A process chamber 201 is formed in a hollow cylindrical portion (an inside of the inner tube 204) of the process container.

The process chamber 201 is configured to be capable of accommodating wafers 200 as substrates in a state where the wafers 200 are arranged in a horizontal posture and in multiple stages in the vertical direction by a boat 217 which will be described later.

Nozzles 410, 420, and 430 are provided in the process chamber 201 so as to penetrate through a sidewall of the manifold 209 and the inner tube 204. Gas supply pipes 310, 320, and 330 are connected to the nozzles 410, 420, and 430, respectively. However, the process furnace 202 of the present embodiment is not limited to the above-described shape.

Mass flow controllers (MFCs) 312, 322, and 332, which are flow rate controllers (flow rate control parts), are provided in the gas supply pipes 310, 320, and 330, respectively, sequentially from the upstream side. Further, valves 314, 324, and 334, which are opening/closing valves, are provided in the gas supply pipes 310, 320, and 330, respectively. A gas supply pipe 340 is connected to the downstream side of the valve 324 of the gas supply pipe 320. A MFC 342 and a valve 344 are provided in the gas supply pipe 340 sequentially from the upstream side. Gas supply pipes 510, 520, and 530 for supplying an inert gas are connected at the downstream side of the valves 314, 324, and 334 of the gas supply pipes 310, 320, and 330 (in the gas supply pipe 320, further the downstream side of a merging part with the gas supply pipe 340), respectively. MFCs 512, 522, and 532, which are flow rate controllers (flow rate control parts), and valves 514, 524, and 534, which are opening/closing valves, are provided in the gas supply pipes 510, 520, and 530, respectively, sequentially from the upstream side.

The nozzles 410, 420, and 430 are connected to the leading ends of the gas supply pipes 310, 320, and 330, respectively. The nozzles 410, 420, and 430 are configured as L-shaped nozzles, and their horizontal portions are formed so as to penetrate through the sidewall of the manifold 209 and the inner tube 204. The vertical portions of the nozzles 410, 420, and 430 are formed inside a channel-shaped (groove-shaped) preliminary chamber 201a formed so as to protrude outward in the radial direction of the inner tube 204 and extend in the vertical direction thereof and are also formed in the preliminary chamber 201a toward the upper side (upper side in the arrangement direction of the wafers 200) along the inner wall of the inner tube 204.

The nozzles 410, 420, and 430 are provided so as to extend from a lower region of the process chamber 201 to an upper region of the process chamber 201, and a plurality of gas supply holes 410a, 420a, and 430a are formed at positions facing the wafers 200, respectively. Thus, a process gas is supplied from the gas supply holes 410a, 420a, and 430a of the respective nozzles 410, 420, and 430 to the wafers 200. A plurality of gas supply holes 410a, 420a, and 430a are formed from a lower portion of the inner tube 204 to an upper portion thereof and have the same aperture area at the same aperture pitch. However, the gas supply holes 410a, 420a, and 430a are not limited to the above-described shape. For example, the aperture area may be gradually increased from the lower portion of the inner tube 204 to the upper portion thereof. This makes it possible to make the flow rate of the gas supplied from the gas supply holes 410a, 420a, and 430a more uniform.

The plurality of gas supply holes 410a, 420a, and 430a of the nozzles 410, 420, and 430 are formed at height positions from a lower portion of the boat 217, which will be described later, to an upper portion thereof. Therefore, the process gas supplied into the process chamber 201 from the gas supply holes 410a, 420a, and 430a of the nozzles 410, 420, and 430 is supplied to the entire region of the wafers 200 accommodated from the lower portion of the boat 217 to the upper portion thereof. The nozzles 410, 420, and 430 are provided so as to extend from the lower region of the process chamber 201 to the upper region thereof, but may be provided so as to extend to the vicinity of the ceiling of the boat 217.

As a process gas, a first gas containing a group XIV element is supplied from the gas supply pipe 310 into the process chamber 201 via the MFC 312, the valve 314, and the nozzle 410.

As a process gas, a halogen-containing gas containing a halogen is supplied from the gas supply pipe 320 into the process chamber 201 via the MFC 322, the valve 324, and the nozzle 420.

As a process gas, an oxygen-containing gas is supplied from the gas supply pipe 330 into the process chamber 201 via the MFC 332, the valve 334, and the nozzle 430.

As a process gas, a hydrogen-containing gas is supplied from the gas supply pipe 340 into the process chamber 201 via the MFC 342, the valve 344, the gas supply pipe 320, and the nozzle 420.

In the present disclosure, a gas obtained by combining a halogen-containing gas and a hydrogen-containing gas supplied into the process chamber 201 via the nozzle 420 is used as a second gas.

As an inert gas, for example, a nitrogen ($N_2$) gas is supplied from the gas supply pipes 510, 520, and 530 to the process chamber 201 via the MFCs 512, 522, and 532, the valves 514, 524, and 534, and the nozzles 410, 420, and 430, respectively. Hereinafter, an example in which the $N_2$ gas is used as the inert gas will be described. However, as the inert gas, in addition to the $N_2$ gas, it may be possible to use, for example, a rare gas such as an argon (Ar) gas, a helium (He) gas, a neon (Ne) gas, a xenon (Xe) gas, or the like.

A process gas supply system mainly includes the gas supply pipes 310, 320, 330, and 340, the MFCs 312, 322, 332, and 342, the valves 314, 324, 334, and 344, and the nozzles 410, 420, and 430. However, it may be considered that the process gas supply system includes only the nozzles 410, 420, and 430. The process gas supply system may be simply referred to as a gas supply system. When the first gas flows from the gas supply pipe 310, a first gas supply system mainly includes the gas supply pipe 310, the MFC 312, and the valve 314. However, it may be considered that the first gas supply system includes the nozzle 410. Further, the first gas supply system may be simply referred to as a group XIV element-containing gas supply system. Further, when the halogen-containing gas and the hydrogen-containing gas flow from the gas supply pipe 320, a halogen-containing gas supply system mainly includes the gas supply pipe 320, the MFC 322, and the valve 324, a hydrogen-containing gas supply system mainly includes the gas supply pipe 340, the MFC 342, and the valve 344, and a second gas supply system mainly includes the halogen-containing gas supply system and the hydrogen-containing gas supply system. However, it may be considered that the second gas supply system includes the nozzle 420. Further, when the oxygen-containing gas flows from the gas supply pipe 330, an oxygen-containing gas supply system mainly includes the gas supply pipe 330, the MFC 332, and the valve 334. However, it may be considered that the oxygen-containing gas supply system includes the nozzle 430. Further, an inert gas supply system mainly includes the gas supply pipes 510, 520, and 530, the MFCs 512, 522, and 532, and the valves 514, 524, and 534.

A method of supplying a gas in the present disclosure is performed by transferring a gas via the nozzles 410, 420, and 430 arranged in the preliminary chamber 201a in an annular vertically long space, which is defined by the inner wall of the inner tube 204 and the ends of a plurality of wafers 200. Then, the gas is discharged into the inner tube 204 from the plurality of gas supply holes 410a, 420a, and 430a formed at positions of the nozzles 410, 420, and 430, which face the wafers. More specifically, the process gas or the like is discharged toward a direction parallel to the surface of the wafers 200 by the gas supply hole 410a of the nozzle 410, the gas supply hole 420a of the nozzle 420, and the gas supply hole 430a of the nozzle 430.

An exhaust hole (exhaust port) 204a is a through-hole formed in a sidewall of the inner tube 204 at a position facing the nozzles 410, 420, and 430. For example, the exhaust hole 204a is a slit-shaped through-hole formed elongated in the vertical direction. A gas supplied into the process chamber 201 from the gas supply holes 410a, 420a, and 430a of the nozzles 410, 420, and 430 and flowing on the surface of the wafers 200 passes through the exhaust hole 204a and flows into an exhaust passage 206 constituted by a gap formed between the inner tube 204 and the outer tube 203. Then, the gas flowing into the exhaust passage 206 flows into an exhaust pipe 231 and is discharged to the outside of the process furnace 202.

The exhaust hole 204a is formed at a position facing the plurality of wafers 200, and a gas supplied from the gas supply holes 410a, 420a, and 430a to the vicinity of the wafers 200 in the process chamber 201 flows toward the horizontal direction and then flows into the exhaust passage 206 through the exhaust hole 204a. The exhaust hole 204a is not limited to the slit-shaped through-hole, but may be configured by a plurality of holes.

The exhaust pipe 231 for exhausting an internal atmosphere of the process chamber 201 is provided in the manifold 209. A pressure sensor 245, which is a pressure detector (pressure detecting part) for detecting an internal pressure of the process chamber 201, an auto pressure controller (APC) valve 243, and a vacuum pump 246 as a vacuum-exhausting device, are connected to the exhaust pipe 231 sequentially from the upstream side. By opening or closing the APC valve 243 while the vacuum pump 246 is actuated, it is capable of performing or stopping a vacuum-exhausting operation in the process chamber 201. Further, by adjusting an opening degree of the APC valve 243 while the vacuum pump 246 is actuated, it is capable of adjusting the internal pressure of the process chamber 201. An exhaust system mainly includes the exhaust hole 204a, the exhaust passage 206, the exhaust pipe 231, the APC valve 243, and the pressure sensor 245. The exhaust system may include the vacuum pump 246.

A seal cap 219 serving as a furnace opening cover configured to hermetically seal a lower end opening of the manifold 209 is provided under the manifold 209. The seal cap 219 is configured to come into contact with the lower end of the manifold 209 from the lower side in the vertical direction. The seal cap 219 is made of, for example, metal such as stainless steel (SUS), and is formed in a disc shape. An O-ring 220b as a seal member making contact with the lower end of the manifold 209 is provided on an upper surface of the seal cap 219. A rotator 267 for rotating the boat 217 in which the wafers 200 are accommodated is installed on the opposite side of the process chamber 201 with respect to the seal cap 219. A rotary shaft 255 of the rotator 267 penetrates through the seal cap 219 and is connected to the boat 217. The rotator 267 is configured to rotate the wafers 200 by rotating the boat 217. The seal cap 219 is configured to be vertically moved up and down by a boat elevator 115 as an elevation mechanism vertically installed outside the outer tube 203. The boat elevator 115 is configured to be capable of loading/unloading the boat 217 into/from the process chamber 201 by moving the seal cap 219 up and down. The boat elevator 115 is configured as a transfer device (transfer system) which transfers the boat 217 and the wafers 200 accommodated in the boat 217 into/out of the process chamber 201.

The boat 217 serving as a substrate support is configured to arrange a plurality of wafers 200, for example, 25 to 200 wafers 200, at intervals in the vertical direction in a horizontal posture with the centers of the wafers 200 aligned with one another. The boat 217 is made of, for example, a heat resistant material such as quartz or SiC. Heat insulating plates 218 made of, for example, a heat resistant material such as quartz or SiC, are installed in a horizontal posture and in multiple stages (not shown) below the boat 217. This configuration makes it difficult to transfer heat from the heater 207 to the seal cap 219 side. However, the present embodiment is not limited to the above-described form. For example, instead of installing the heat insulating plates 218, a heat insulating cylinder configured as a cylindrical member made of a heat resistant material such as quartz or SiC may be installed below the boat 217.

Figure 2:
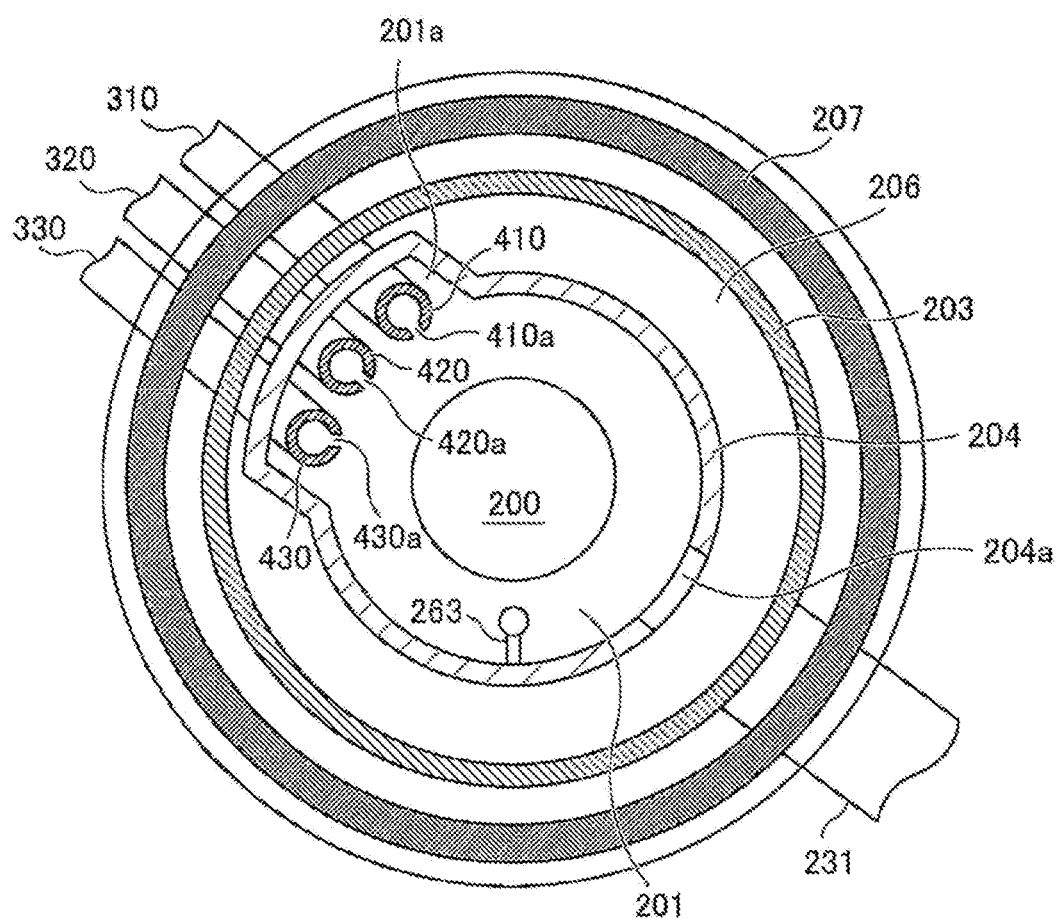
FIG. 2 is a schematic horizontal cross-sectional view taken along line A-A in FIG. 1.

As shown in FIG. 2, a temperature sensor 263 serving as a temperature detector is installed in the inner tube 204. Based on temperature information detected by the temperature sensor 263, a state of supplying electric power to the heater 207 is adjusted such that the interior of the process chamber 201 has a desired temperature distribution. The temperature sensor 263 is configured as an L-shape, like the nozzles 410, 420, and 430, and is provided along the inner wall of the inner tube 204.

Figure 3:
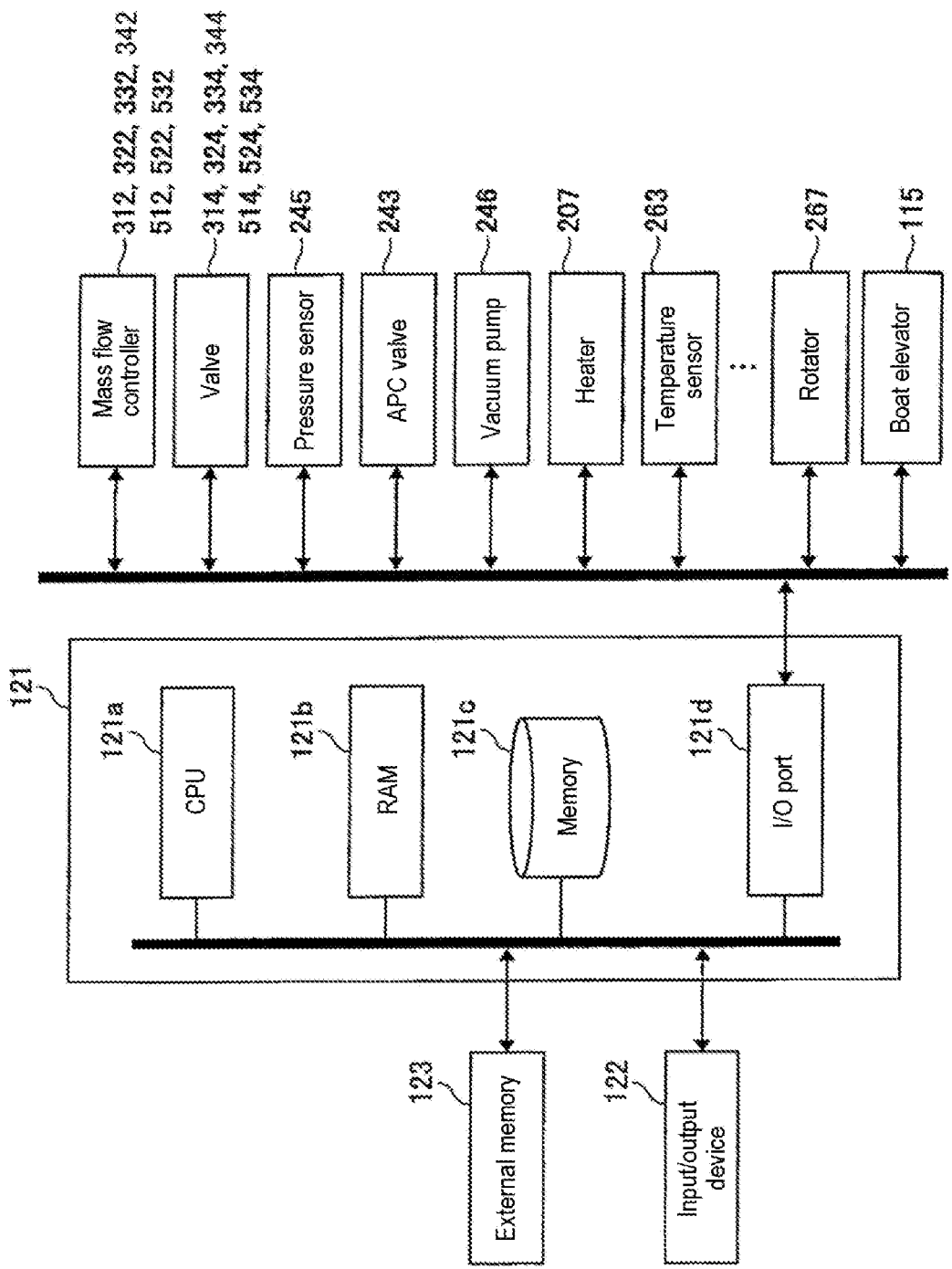
FIG. 3 is a schematic configuration diagram of a controller of a substrate processing apparatus according to embodiments of the present disclosure, in which a control system of the controller is illustrated in a block diagram.
Figure 4:
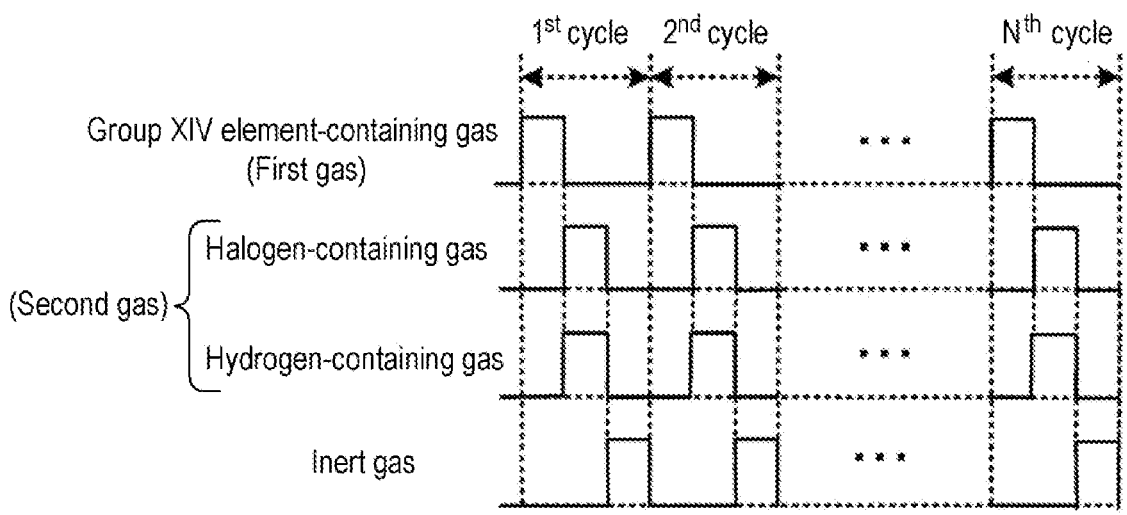
FIG. 4 is a diagram showing a substrate processing sequence according to embodiments of the present disclosure.

As shown in FIG. 3, a controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus. An input/output device 122 formed of, for example, a touch panel or the like, is connected to the controller 121.

The memory 121c is configured by, for example, a flash memory, a hard disk drive (HDD), or the like. A control program for controlling operations of a substrate processing apparatus and a process recipe in which sequences and conditions of a method of manufacturing a semiconductor device, which will be described later, are written, are readably stored in the memory 121c. The process recipe functions as a program for causing the controller 121 to execute each step in the method of manufacturing a semiconductor device, which will be described later, to obtain a predetermined result. Hereinafter, the process recipe and the control program may be generally and simply referred to as a "program." When the term "program" is used herein, it may indicate a case of including the process recipe only, a case of including the control program only, or a case of including a combination of the process recipe and the control program. The RAM 121b is configured as a memory area (work area) in which a program or data read by the CPU 121a is temporarily stored.

The I/O port 121d is connected to the MFCs 312, 322, 332, 342, 512, 522, and 532, the valves 314, 324, 334, 344, 514, 524, and 534, the pressure sensor 245, the APC valve 243, the vacuum pump 246, the heater 207, the temperature sensor 263, the rotator 267, the boat elevator 115, and the like.

The CPU 121a is configured to read and execute the control program from the memory 121c. The CPU 121a is also configured to read the recipe from the memory 121c according to an input of an operation command from the input/output device 122. The CPU 121a is configured to be capable of controlling the flow rate adjustment operation of various kinds of gases by the MFCs 312, 322, 332, 342, 512, 522, and 532, the opening/closing operation of the valves 314, 324, 334, 344, 514, 524, and 534, the opening/closing operation of the APC valve 243, the pressure adjusting operation performed by the APC valve 243 based on the pressure sensor 245, the temperature adjusting operation performed by the heater 207 based on the temperature sensor 263, the actuating and stopping of the vacuum pump 246, the operation of rotating the boat 217 with the rotator 267 and adjusting the rotation speed of the boat 217, the operation of moving the boat 217 up and down by the boat elevator 115, the operation of accommodating the wafers 200 in the boat 217, and the like, according to contents of the read recipe.

The controller 121 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, or a semiconductor memory such as a USB memory or a memory card) 123. The memory 121c and the external memory 123 are configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. The program may be provided to the computer using a communication means such as the Internet or a dedicated line, instead of using the external memory 123.

(2) Substrate Processing Process

As one process of manufacturing a semiconductor device, an example of a process (etching method) of etching a group XIV element-containing film containing a group XIV element such as silicon (Si), which is formed on a wafer 200, will be described with reference to FIGS. 4 and 5A to 5D. This process is performed using the process furnace 202 of the above-described substrate processing apparatus 10. In the following description, the operations of various parts constituting the substrate processing apparatus 10 can be controlled by the controller 121.

A substrate processing process (a process of manufacturing a semiconductor device) according to the present disclosure includes:
 (a) a step of supplying a first gas containing a group XIV element to a wafer 200 which is arranged in a process container and on which a film containing the group XIV element is formed such that reaction by-products generated by reaction with the group XIV element contained in the film formed on the wafer 200 are saturated and adsorbed on the wafer 200;
 (b) a step of supplying a second gas containing a halogen after (a); and
 (c) a step of etching the film containing the group XIV element formed on the wafer 200 by alternately repeating (a) and (b).

When the term "wafer" is used in the present disclosure, it may refer to "a wafer itself" or "a wafer and a laminated body of certain layers or films formed on a surface of a wafer." When the phrase "a surface of a wafer" is used in the present disclosure, it may refer to "a surface of a wafer itself" or "a surface of a certain layer or film formed on a wafer". When the term "substrate" is used in the present disclosure, it may be synonymous with the term "wafer."

(Wafer Loading)

When a plurality of wafers 200 is charged in the boat 217 (wafer charging), as shown in FIG. 1, the boat 217 supporting the plurality of wafers 200 is lifted up by the boat elevator 115 and is loaded into the process chamber 201 (boat loading) and arranged in the process container. In this state, the seal cap 219 seals the lower end of the outer tube 203 via the O-ring 220.

(Pressure Adjustment and Temperature Adjustment)

The interior of the process chamber 201, that is, a space where the wafer 200 is placed, is vacuum-exhausted by the vacuum pump 246 to reach a desired pressure (degree of vacuum). At this time, the internal pressure of the process chamber 201 is measured by the pressure sensor 245. The APC valve 243 is feedback-controlled based on the measured pressure information (pressure adjustment). The vacuum pump 246 always keeps in operation at least until processing on the wafers 200 is completed. The interior of the process chamber 201 is heated by the heater 207 to a desired temperature. At this time, the state of supplying electric power to the heater 207 is feedback-controlled based on the temperature information detected by the temperature sensor 263 such that the interior of the process chamber 201 has a desired temperature distribution (temperature adjustment). Heating the interior of the process chamber 201 by the heater 207 may be continuously performed at least until the processing on the wafers 200 is completed.

(First Gas (Group XIV Element-Containing Gas) Supply, First Step)

The valve 314 is opened to allow a first gas to flow into the gas supply pipe 310. The flow rate of the first gas is adjusted by the MFC 312, and the first gas is supplied into the process chamber 201 from the gas supply hole 410a of the nozzle 410 and is exhausted through the exhaust pipe 231.

At this time, the first gas is supplied such that reaction by-products generated by reaction with a group XIV element contained in a group XIV element-containing film formed on the wafer 200 is saturated and adsorbed on the wafer 200. Here, in the present disclosure, the saturation means that adsorbable sites do not have to be completely filled, but may be substantially saturated. That is, in order to improve productivity, it may be in a state where the adsorbable sites are not completely saturated, in other words, it may be in a state where the reaction is not completely converged. In addition, in a combination of a gas type and a film type having a saturation curve in a region where the characteristic of the reaction amount with respect to the gas supply time is larger than that in a certain supply time, using a state that is not completely saturated on the saturation curve may be referred to as saturated adsorption in the present disclosure. At least one effect of the present disclosure can be obtained with one supply time on the saturation curve. When the supply time is set as the region of the supply time in which such a saturation curve can be obtained, it can also be referred to a supply using the saturated adsorption characteristic.

At this time, the first gas is supplied to the wafer 200 at an atmosphere in which the first gas is decomposed. The atmosphere in which the first gas is decomposed is a temperature such that the temperature of the wafer 200 is, for example, within a range of 350 degrees C. to 500 degrees C. Specifically, for example, when a dichlorosilane ($SiH_2Cl_2$, abbreviation: DCS) gas is used as the first gas, the atmosphere is a temperature such that the temperature of the wafer 200 is within the range of 350 degrees C. to 500 degrees C.

That is, the temperature of the heater 207 is set to a temperature such that the temperature of the wafer 200 is within the range of, for example, 350 to 500 degrees C. The notation of a numerical range such as "350 to 500 degrees C." in the present disclosure means that the lower limit value and the upper limit value are included in the range. Therefore, for example, "350 to 500 degrees C." means "350 degrees C. or higher and 500 degrees C. or lower." The same applies to other numerical ranges.

At this time, the APC valve 243 is adjusted such that the internal pressure of the process chamber 201 is set to, for example, a pressure within a range of 20 to 100 Pa. The supply flow rate of the group XIV element-containing gas, which is controlled by the MFC 312 is, for example, a flow rate within a range of 0.1 to 1.0 slm. The time for supplying the first gas to the wafer 200 is, for example, a time within a range of 15 to 30 seconds.

As the first gas, for example, a DCS gas, which is a gas containing silicon (Si) that is a group XIV element, and is a chlorosilane-based gas, can be used.

Figure 5A:
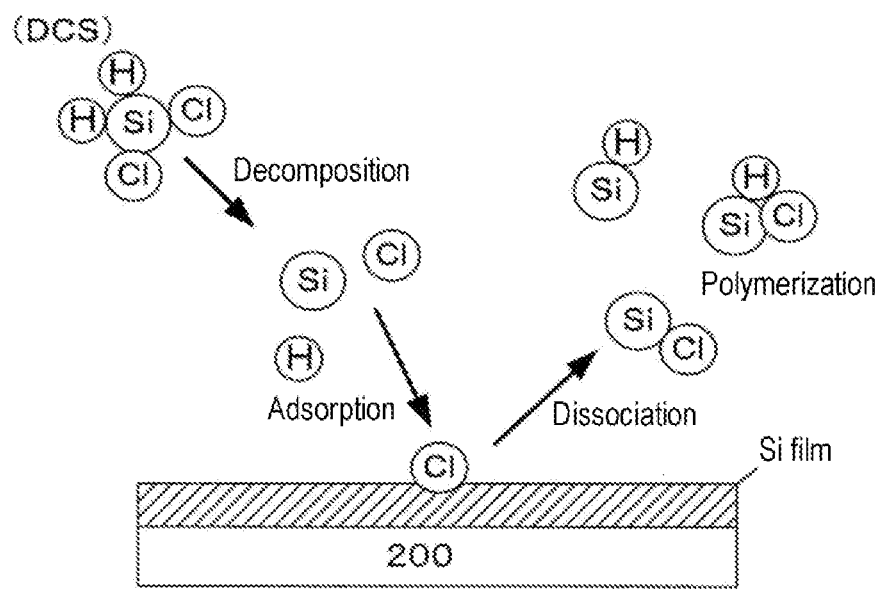
FIGS. 5A to 5D are schematic views for explaining a state of a substrate surface in the substrate processing sequence shown in FIG. 4.

Specifically, for example, when the DCS gas is used as the first gas and a Si film which is a film containing Si as a main component is used as the group XIV element-containing film, as shown in FIG. 5A, by the supply of the DCS gas, the DCS gas is decomposed and adsorbed on the wafer 200 (base film on the surface thereof) having the Si film formed on the surface thereof. At this time, Si on the surface of the wafer 200 reacts with Cl decomposed from the DCS gas to generate SiCl which is a reaction by-product. Further, the generated SiCl is dissociated from the surface of the wafer 200, and dissociated molecules are polymerized.

Figure 5B:
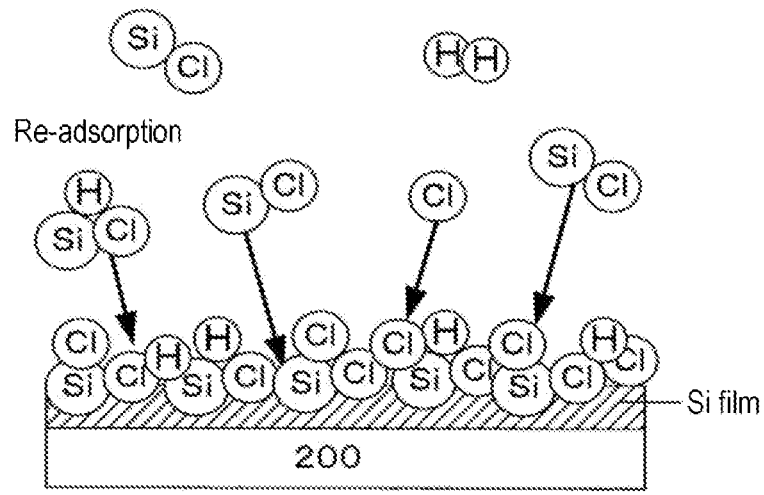

Then, as shown in FIG. 5B, the dissociated SiCl and the polymerized molecules are re-adsorbed on the wafer 200. In this re-adsorption, since the number of adsorbable adsorption sites decreases over time, the amount of adsorption becomes saturated. Such saturation is also called self-limit. That is, a SiCl layer (inhibitor layer) containing SiCl as a main component, such as $SiCl_2$ or $SiCl_4$, is generated on the surface of the wafer 200. This SiCl layer has an effect of suppressing the adsorption of a newly supplied DCS gas, newly generated dissociated SiCl, and newly generated polymerized molecules, which is called an inhibitor effect, and such a layer is called an inhibitor layer. Here, in an undecomposed gas, since it is difficult to generate SiCl, it is difficult to obtain the inhibitory effect. That is, in the undecomposed gas, physical adsorption of gas molecules themselves occurs, the amount of physical adsorption continues to increase, which leads to a possibility that the physical adsorption is not saturated. In addition, the undecomposed gas reacts with the Si film, and etching continues to proceed, which leads to a possibility that the etching is not stopped. By supplying the Si film on the wafer 200 at an atmosphere in which the DCS gas is decomposed, Cl contained in the DCS gas can be reacted with Si on the wafer 200 to promote the generation of SiCl.

(Second Gas (Halogen-Containing Gas and Hydrogen-Containing Gas) Supply, Second Step)

After a predetermined time has elapsed from the start of the supply of the first gas, the valve 314 is closed to stop the supply of the first gas into the process chamber 201. At this time, the valves 324 and 344 are opened, and a halogen-containing gas and a hydrogen-containing gas simultaneously flow into the gas supply pipe 320. That is, after the supply of the first gas, the supply of a second gas is started without supplying a purge gas.

The flow rates of the halogen-containing gas and the hydrogen-containing gas are adjusted by the MFCs 322 and 342, respectively, and the halogen-containing gas and the hydrogen-containing gas are supplied into the process chamber 201 from the gas supply hole 420a of the nozzle 420 and are exhausted through the exhaust pipe 231. In this operation, the second gas is supplied to the wafer 200.

At this time, the second gas, which is a combination of the halogen-containing gas and the hydrogen-containing gas, is supplied to the wafer 200 at an atmosphere in which the second gas is not decomposed. The atmosphere in which the second gas is not decomposed is a temperature such that the temperature of the wafer 200 is within a range of, for example, 350 degrees C. to 500 degrees C. Specifically, for example, when a $Cl_2$ gas is used as the second gas, the atmosphere is a temperature such that the temperature of the wafer 200 is within the range of 350 degrees C. to 500 degrees C.

At this time, the APC valve 243 is adjusted such that the internal pressure of the process chamber 201 is set to, for example, a pressure within a range of 20 to 100 Pa. The supply flow rate of the halogen-containing gas, which is controlled by the MFC 322 is, for example, a flow rate within a range of 0.01 to 0.10 slm. The supply flow rate of the hydrogen-containing gas, which is controlled by the MFC 342 is, for example, a flow rate within a range of 0.1 to 2.0 slm. The time for supplying the halogen-containing gas and the hydrogen-containing gas to the wafer 200 at the same time is, for example, a time within a range of 2 to 5 seconds.

In this operation, the second gas, which is a mixture of the halogen-containing gas and the hydrogen-containing gas, is supplied to the wafer.

As the second gas, for example, a chlorine ($Cl_2$) gas, which is a halogen-containing gas, and a hydrogen ($H_2$) gas, which is a hydrogen-containing gas, can be used.

Figure 5C:
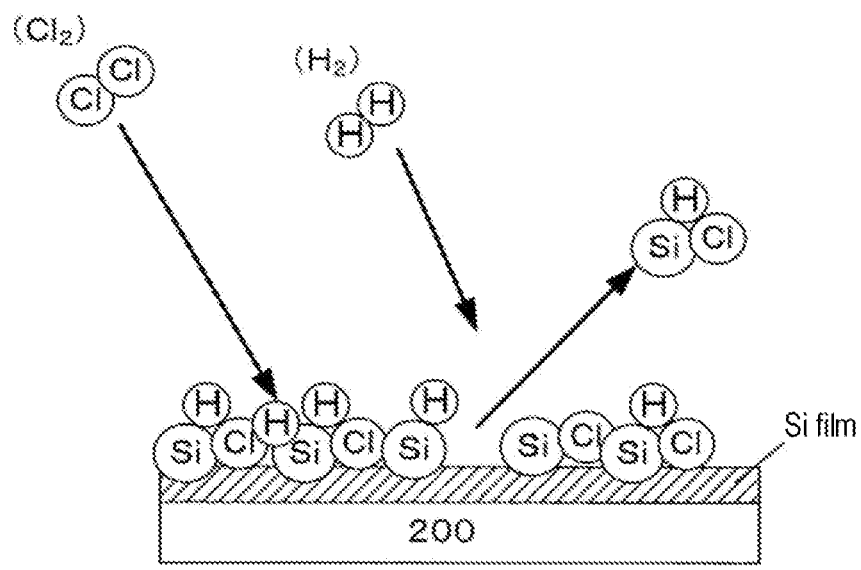

Specifically, for example, when the $Cl_2$ gas and the $H_2$ gas are used as the second gas, as shown in FIG. 5C, by the supply of the second gas, a portion of the SiCl layer generated on the surface of the wafer 200 reacts to produce reaction by-products. That is, Si contained in the SiCl layer is bonded to Cl contained in the $Cl_2$ gas or H contained in the $H_2$ gas, so that the Si film on the wafer 200 is etched. Specifically, Si, Cl, and H molecules adsorbed on the wafer 200 react with the $Cl_2$ gas and $H_2$ gas as the second gas, so that Si, Cl, or H are dissociated from the SiCl layer and the Si film of the surface of the wafer 200 is etched. That is, by not decomposing the second gas, $Cl_2$ can be supplied to the SiCl layer generated on the surface of the wafer 200 in the first step, and the removal efficiency of the SiCl layer can be improved. This makes it possible to improve the etching controllability of the Si film.

Here, when purging is performed between the first gas supply and the second gas supply, SiCl adsorbed on the Si film surface is removed and the Si film to be etched is exposed, which makes it difficult to obtain the etching characteristics for each layer and leads to a possibility that the etching rate decreases. By not performing purging between the first gas supply and the second gas supply, the surface of the Si film to be etched is kept covered with SiCl, which makes it easier to obtain the etching effect for each layer. That is, it is possible to improve the etching rate and the in-plane uniformity by etching.

(Purging, Third Step)

After a predetermined time has elapsed from the start of the supply of the second gas, for example, after 1 to 30 seconds, the valves 324 and 344 are closed to stop the supply of the second gas. At this time, with the APC valve 243 of the exhaust pipe 231 opened, the interior of the process chamber 201 is vacuum-exhausted by the vacuum pump 246 to remove a residual gas from the surface of the wafer 200, so that an unreacted second gas and reaction by-products remaining in the process chamber 201 are excluded from the process chamber 201. At this time, the valves 514, 524, and 534 are opened to supply an inert gas as a purge gas into the process chamber 201 to purge the interior of the process container. The inert gas acts as a purge gas and can enhance the effect of removing the residual gas from the wafer 200, thereby excluding the unreacted second gas and reaction by-products remaining in the process chamber 201 from the process chamber 201. The supply flow rates of the inert gas controlled by the MFCs 512, 522, and 532 is, for example, 0.1 to 2.0 slm, respectively.

Figure 5D:
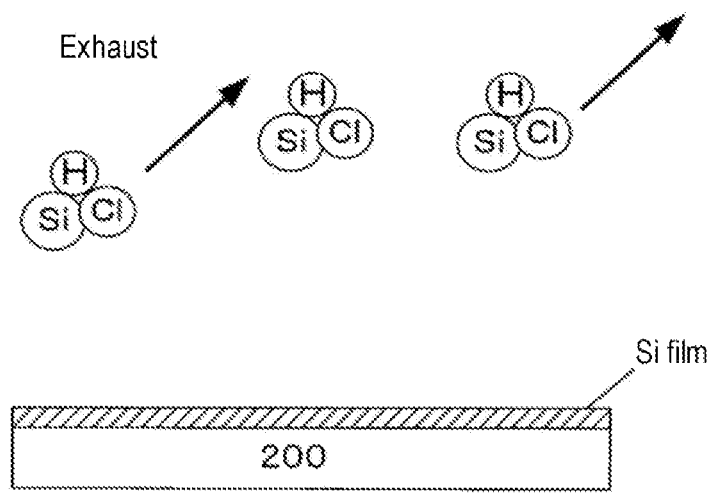

By performing the purging in this way, as shown in FIG. 5D, reaction by-products generated by etching can be removed. Further, when a cycle process is performed, reaction between the second gas, the reaction by-products, and the first gas can be suppressed by performing the purging. In addition, it is possible to prevent the self-limit effect at the time of supplying the first gas from diminishing due to the reaction between the second gas, the reaction by-products, and the first gas. That is, by performing the purging, it is possible to improve the self-limit effect at the time of supplying the first gas.

(Performing Predetermined Number of Times)

By performing a cycle a predetermined number of times (N times), once or more, the cycle including sequentially performing the above-described first to third steps, the film containing the group XIV element formed on the wafer 200 is etched. That is, by alternately repeating the first to third steps, it is possible to etch the film containing the group XIV element formed on the wafer 200.

(After-Purging and Returning to Atmospheric Pressure)

An inert gas is supplied into the process chamber 201 from each of the gas supply pipes 510 to 530 and is exhausted through the exhaust pipe 231. The inert gas acts as a purge gas, whereby the interior of the process chamber 201 is purged with the inert gas to remove a gas and reaction by-products remaining in the process chamber 201 from the process chamber 201 (after-purging). After that, the internal atmosphere of the process chamber 201 is substituted with the inert gas (inert gas substitution), and the internal pressure of the process chamber 201 is returned to the atmospheric pressure (returning to atmospheric pressure).

(Wafer Unloading)

After that, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). After that, the processed wafers 200 are discharged from the boat 217 (wafer discharging).

(3) Effects of the Present Embodiment

According to the present embodiment, one or more effects set forth below may be achieved.
(a) It is possible to enhance the etching controllability of a film containing a group XIV element.
(b) It is possible to perform the micro-fabrication of a film containing a group XIV element.

(4) Other Embodiments

The embodiments of the present disclosure have been specifically described above. However, the present disclosure is not limited to the above-described embodiment, and various modifications can be made without departing from the gist thereof.

(Modification 1)

Figure 6:
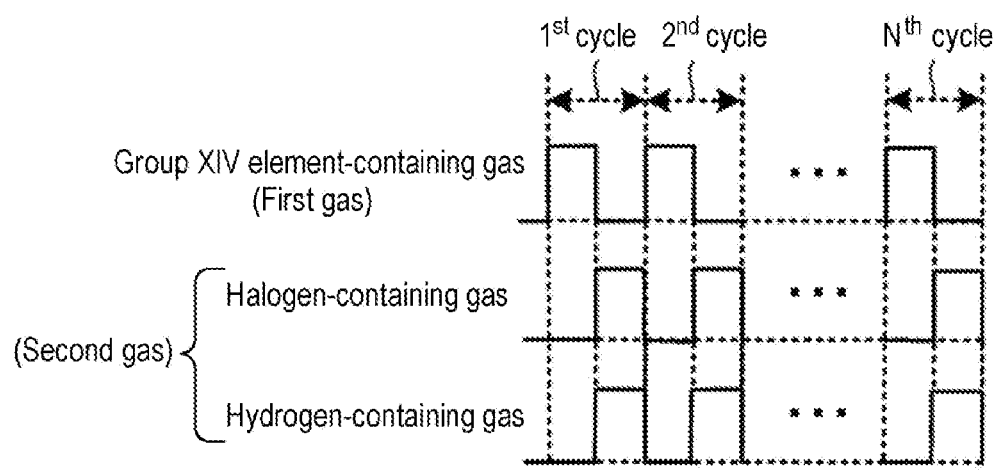
FIG. 6 is a diagram showing a modification of a substrate processing sequence according to embodiments of the present disclosure.

FIG. 6 shows a modification of the substrate processing sequence according to the embodiments of the present disclosure. In this modification, the group XIV element-containing film formed on the wafer 200 is etched by performing the cycle a predetermined number of times (N times), once or more, the cycle including sequentially performing the above-described first and second steps. That is, the purging of the above-described third step is not performed. Even in this case, it is possible to etch the film containing the group XIV element.

(Modification 2)

Figure 7:
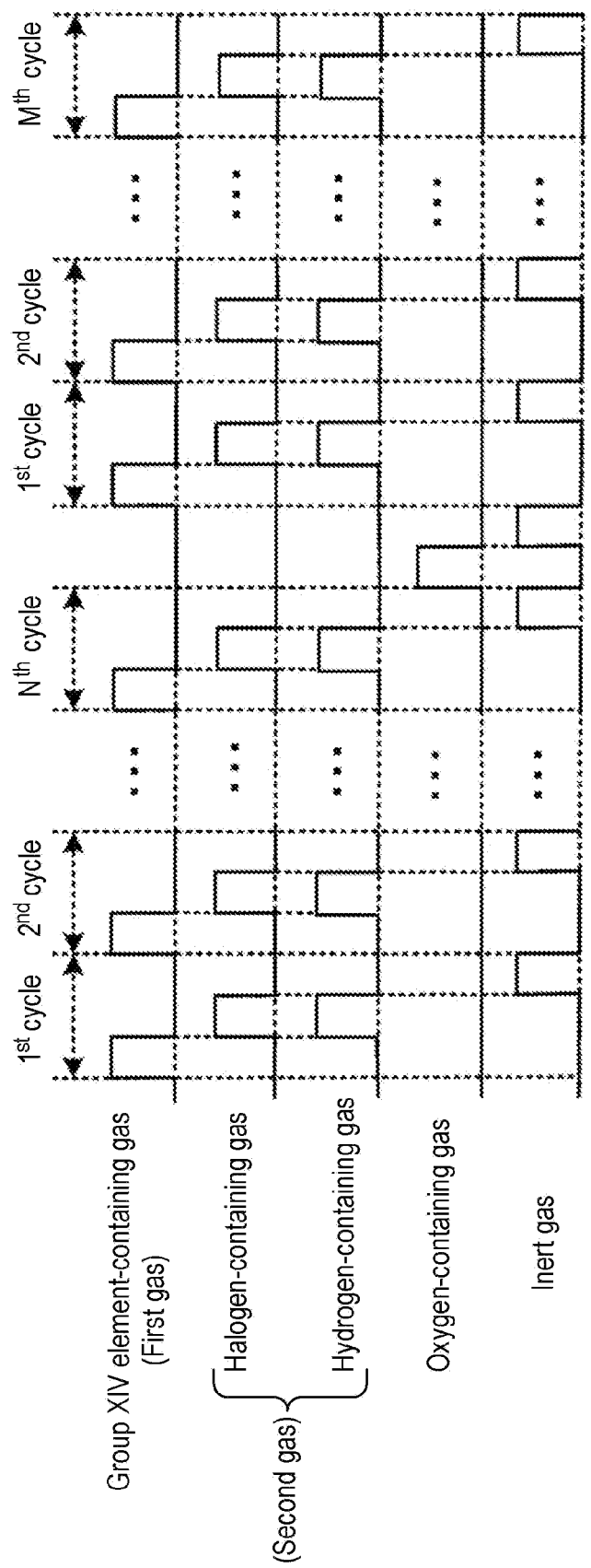
FIG. 7 is a diagram showing a modification of a substrate processing sequence according to embodiments of the present disclosure.

FIG. 7 shows another modification of the substrate processing sequence according to the embodiments of the present disclosure. In this modification, an oxygen-containing gas is supplied from an oxygen-containing gas supply system after performing the cycle a predetermined number of times (N times), the cycle including sequentially performing the above-described first to third steps. Then, after supplying an inert gas (purge gas), a cycle including sequentially performing the first to third steps is performed a predetermined number of times (M times). That is, in the middle of repeating the above-described first to third steps, the oxygen-containing gas is supplied to oxidize the surface of the wafer 200. As a result, the surface of the wafer 200 is oxidized during the etching, so that excessive etching can be suppressed. In addition, the etching amount (etching film thickness) can be adjusted, so that the etching controllability can be improved.

As the oxygen-containing gas, an oxygen ($O_2$) gas, an ozone ($O_3$) gas, water vapor (1120), or the like can be used.

(Modification 3)

Figure 8A:
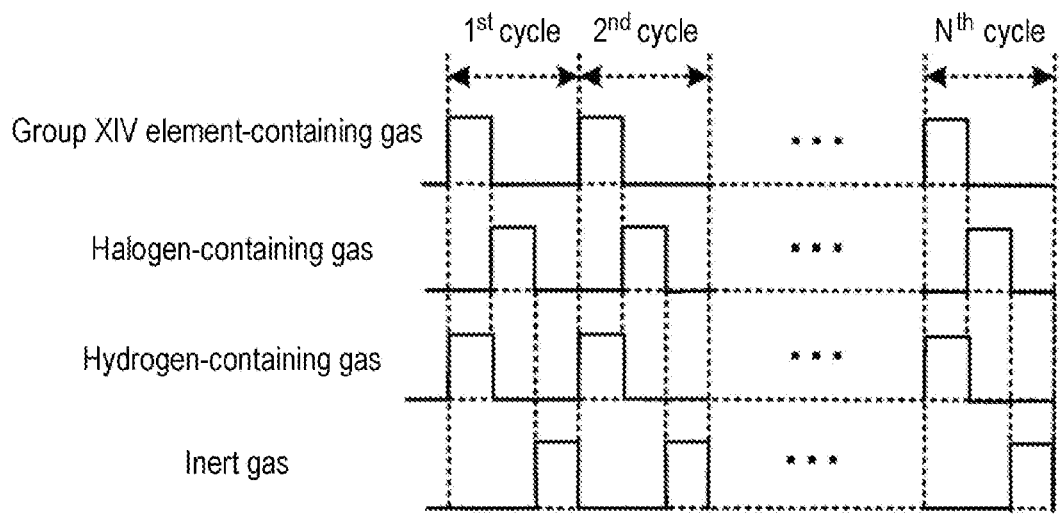
FIGS. 8A and 8B are diagrams showing modifications of a substrate processing sequence according to embodiments of the present disclosure.
Figure 8B:
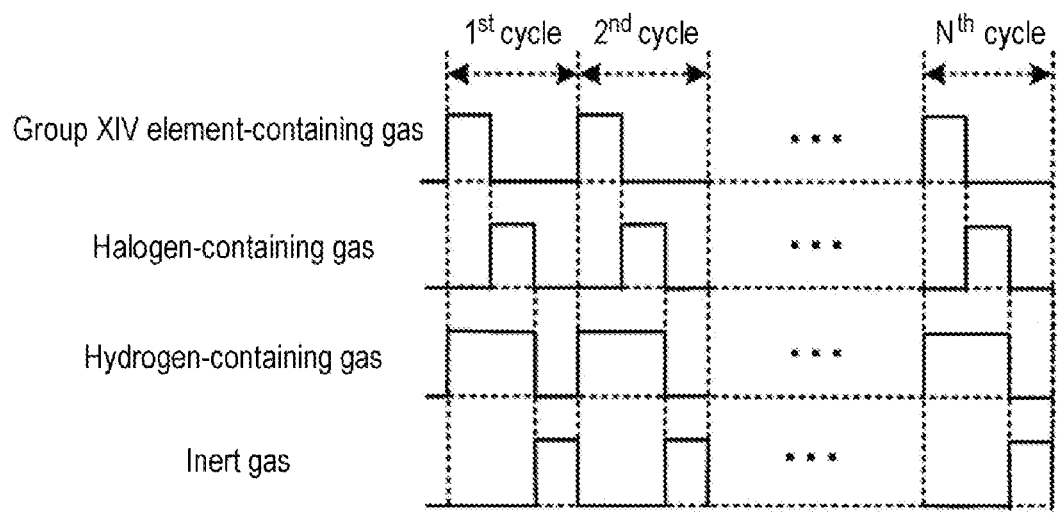

FIGS. 8A and 8B show other modifications of the substrate processing sequence according to the embodiments of the present disclosure. In this modification, as shown in FIG. 8A, as the first gas in the above-described first step, a hydrogen-containing gas is supplied in addition to the group XIV element-containing gas. That is, the hydrogen-containing gas is supplied in parallel with the supply of the group XIV element-containing gas in the above-described first step. Then, a halogen-containing gas is supplied as the second gas in the second step. That is, in the second step, the hydrogen-containing gas is not supplied.

Further, as shown in FIG. 8B, a hydrogen-containing gas may be supplied in addition to each gas in both the above-described first and second steps. That is, the hydrogen-containing gas may be supplied in parallel with the supply of the group XIV element-containing gas in the first step and the supply of the halogen-containing gas in the second step.

That is, the hydrogen-containing gas is supplied in addition to the supply of each gas in one or both of the first and second steps. As a result, it is possible to perform each step while removing reaction by-products and enhance the etching controllability while improving the processing quality.

As the hydrogen-containing gas, a hydrogen ($H_2$) gas, an activated hydrogen gas, or the like can be used.

(Modification 4)

Next, when a film containing the group XIV element, which is an etching target, is a doped Si film doped with phosphorus (P), which is a predetermined element, and a non-doped Si film not doped with P and the above-described first step to third steps are performed on the wafer 200 having the doped Si film and the non-doped Si film formed on the surface of the wafer 200, the effect of the above-described etching will be described.

First, by the supply of the first gas in the first step, the same reaction as shown in FIGS. 5A and 5B in the first step occurs on the doped Si film and the non-doped Si film.

Then, by the supply of the second gas in the second step, a reaction is suppressed on the doped Si film as compared with the non-doped Si film, and a reaction as shown in FIG. 5C in the second step occurs on the non-doped Si film to be etched.

That is, by performing the above-described first to third steps, it is possible to selectively etch the non-doped Si film.

(Modification 5)

Next, when a film containing the group XIV element, which is an etching target, is a crystalline Si film, which is a single crystal Si film or a polycrystalline Si film, and a non-crystalline Si film which is an amorphous Si film, and the above-described first step to third steps are performed on the wafer 200 having the crystalline Si film and the non-crystalline Si film formed on the surface of the wafer 200, the effect of the above-described etching will be described.

Normally, it is easier to etch the non-crystalline Si film than the crystalline Si film. That is, when the etching is performed according to the etching rate of the crystalline Si film, the non-crystalline Si film may be etched more than a predetermined film thickness, resulting in over-etching. It is considered that this is because the etching rate differs depending on the grain boundaries of the crystal and the arrangement of atoms.

By performing the above-described first to third steps, both the crystalline Si film and the non-crystalline Si film are etched. It is considered that this is because the etching by the first gas is self-stopped (saturation-stopped) due to the inhibitor effect, and therefore it is difficult to receive a difference in etching rate due to the crystallinity. That is, according to the present disclosure, it is possible to reduce the difference in etching rate between the crystalline Si film and the non-crystalline Si film, thereby suppressing over-etching.

(Modification 6)

Next, when a film containing the group XIV element, which is an etching target, is a silicon oxide ($SiO_2$) film, which is an oxide film, and a Si film, which is a non-oxide film, and the above-described first step to third steps are performed on the wafer 200 having the $SiO_2$ film and the Si film formed on the surface of the wafer 200, the effect of the above-described etching will be described.

By performing the above-described first to third steps, the Si film, which is the non-oxide film, is etched. That is, it is possible to selectively etch the non-oxide film. Here, as the non-oxide film, in addition to the Si film, a doped Si film doped with P, a silicon nitride (SiN) film, or the like can be used.

(Modification 7)

Next, when a film containing the group XIV element, which is an etching target, is a SiN film, which is a nitride film, and a Si film, which is a non-nitride film, and the above-described first step to third steps are performed on the wafer 200 having the SiN film and the Si film formed on the surface of the wafer 200, the effect of the above-described etching will be described.

By performing the above-described first to third steps, the Si film, which is the non-nitride film, is etched. That is, it is possible to selectively etch the non-nitride film.

(Modification 8)

Next, when a film containing the group XIV element, which is an etching target, is a Si film, which is a non-oxide film, and the above-described first step to third steps are performed on the wafer 200 formed with a laminated film in which the Si film, which is the non-oxide film, is formed on a $SiO_2$ film, which is an oxide film, the effect of the above-described etching will be described.

By performing the above-described first to third steps, the Si film, which is the non-oxide film, is etched. That is, the $SiO_2$ film, which is the oxide film, becomes an etching stopper, so that it is possible to selectively etch the non-oxide film.

In the above embodiment, the case where the purging is not performed between the first gas supply and the second gas supply has been described, but the present disclosure is not limited thereto. The purging may be performed between the first gas supply and the second gas supply.

Further, in the above embodiment, the case where the Si film is used as the Si-containing film containing Si as a main component, which is a film containing the group XIV element, has been described, but the present disclosure is not limited thereto. As the Si-containing film, a single crystal Si film, a polycrystalline Si film, an amorphous Si film, a SiN film, a doped Si film, a non-doped Si film, or the like can be used.

As the doped Si film, a Si film doped with phosphorus (P) as a dopant or a Si film doped with boron (B) as a dopant can be used.

Further, in the above embodiments, as the film containing the group XIV element, for example, a film containing another group XIV element such as germanium (Ge) can be suitably applied.

Further, in the above embodiments, the case where the DCS gas containing, for example, silicon (Si), is used as the gas containing the group XIV element as the first gas has been described, but the present disclosure is not limited thereto. It can also be suitably applied to a case where a gas containing another group XIV element such as germanium (Ge) is used.

Specifically, as the first gas, for example, a chlorosilane-based gas such as a gas including at least one or more selected from the group of a dichlorosilane ($SiH_2Cl_2$, abbreviation: DCS) gas, a hexachlorodisilane ($Si_2Cl_6$, abbreviation: HCDS) gas, and silicon tetrachloride ($SiCl_4$) gas can be used. Further, as the first gas, a silane-based gas such as a monosilane ($SiH_4$) gas, a disilane ($Si_2H_6$) gas, or a trisilane ($Si_3H_8$) gas can be used. More particularly, the chlorosilane-based gas containing Si and Cl, which easily cause a saturation reaction, is used. Further, in the case of the silane-based gas, the effects similar to those of the chlorosilane-based gas can be obtained by supplying the gas in a cycle. That is, the same kind of effects can be obtained when the halogen species of the second gas supplied in the $X^{th}$ cycle remain until the $(X+1)^{th}$ cycle and thereafter. Here, X is an integer.

As the first gas containing Ge, for example, a chlorogermane-based gas such as a gas including at least one or more selected from the group of a chlorogermane ($GeH_2Cl_2$) gas, a hexachlorodigermane ($Ge_2Cl_6$, also known as a digermanium hexachloride) gas, and a germanium tetrachloride ($GeCl_4$) gas, can be used. Further, as the first gas containing Ge, a germane-based gas such as a monogerman ($GeH_4$) gas, a digermane ($Ge_2H_6$) gas, or a trigermane ($Ge_3H_8$) gas can be used. More particularly, the chlorogermane-based gas containing Ge and Cl, which easily cause a saturation reaction, is used. Further, in the case of the germane-based gas, the effects similar to those of the chlorogermane-based gas can be obtained by supplying the gas in a cycle. That is, the same kind of effects can be obtained when the halogen species of the second gas supplied in the $X^{th}$ cycle remain until the $(X+1)^{th}$ cycle and thereafter. Here, X is an integer.

Further, as the second gas, for example, a combination of at least one selected from the group of a chlorine ($Cl_2$) gas, which is a halogen-containing gas and contains chlorine, a hydrogen chloride (HCl) gas, a boron trichloride ($BCl_3$) gas, a silicon tetrachloride ($SiCl_4$) gas, and a mixture of a monosilane ($SiH_4$) gas and a $Cl_2$ gas, and a hydrogen-containing gas, can be used. Further, as the hydrogen-containing gas, a $H_2$ gas or the like can be used.

Further, as the second gas, for example, a combination of at least one selected from the group of a chlorine ($Cl_2$) gas, a hydrogen chloride (HCl) gas, a boron trichloride ($BCl_3$) gas, a silicon tetrachloride ($SiCl_4$) gas, and a mixture of a monosilane ($SiH_4$) gas and a $Cl_2$ gas, and a fluorine (F)-based gas or a bromine (Br)-based gas, can be used.

Further, the etching selectivity can be improved by using a Cl-based gas containing chlorine as the second gas, but the same effects can be obtained even when an F-based gas or a Br-based gas is used.

Further, as the second gas, a silicon tetrachloride ($SiCl_4$) gas or a monosilane ($SiH_4$) gas may be replaced with a gas such as a germanium tetrachloride ($GeCl_4$) gas or a monogerman ($GeH_4$) gas.

Further, in the above embodiments, the example in which the halogen-containing gas and the hydrogen-containing gas are supplied into the process chamber 201 via the same nozzle 420 has been described, but the present disclosure is not limited thereto, and these gases may be supplied from another nozzle.

Further, in the above embodiments, the example in which a film is formed by using the substrate processing apparatus which is a batch-type substrate processing apparatus capable of processing a plurality of substrates at a time has been described, but the present disclosure is not limited thereto. For example, the present disclosure can be suitably applied to even a case where a film is formed by using a single-wafer type substrate processing apparatus capable of processing a single substrate or several substrates at a time.

Figure 9A:
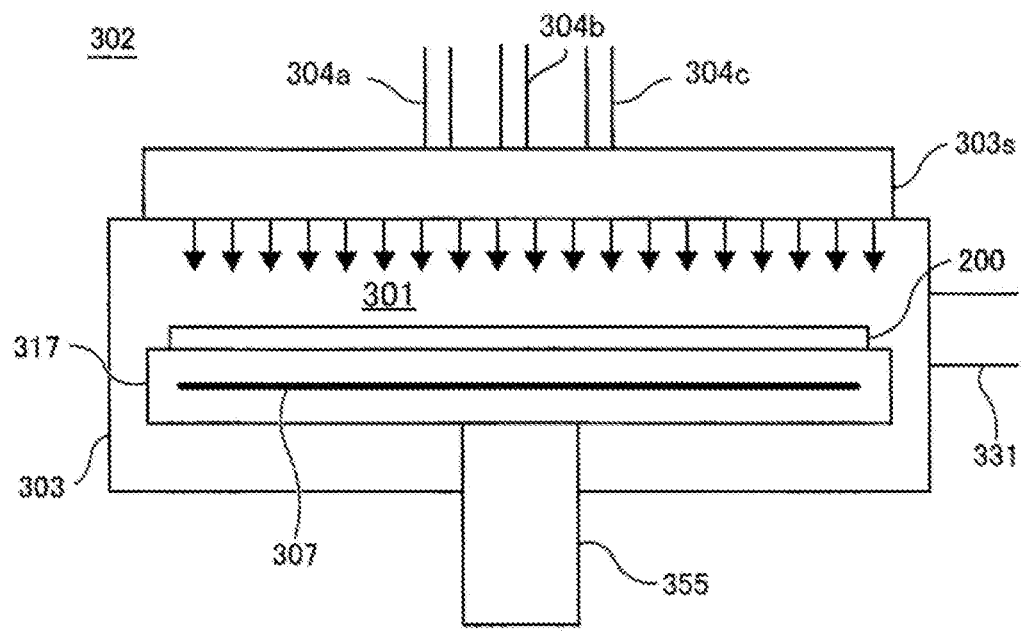
FIGS. 9A and 9B are vertical sectional views showing an outline of a process furnace of a substrate processing apparatus according to another embodiment of the present disclosure.

For example, the present disclosure can be suitably applied to even a case where a film is formed by using a substrate processing apparatus including a process furnace 302 shown in FIG. 9A. The process furnace 302 includes a process container 303 forming a process chamber 301, a shower head 303s that supplies a gas into the process chamber 301 in a shower shape, a support 317 that supports one or several wafers 200 in a horizontal posture, a rotary shaft 355 that supports the support 317 from below, and a heater 307 provided in the support 317. A gas supply port 304a for supplying the above-described first gas, a gas supply port 304b for supplying the above-described second gas, and a gas supply port 304c for supplying the above-described third gas are connected to an inlet (gas introduction port) of the shower head 303s. A first gas supply system similar to the first gas supply system of the above-described embodiments is connected to the gas supply port 304a. A second gas supply system similar to the second gas supply system of the above-described embodiment is connected to the gas supply port 304b. An oxygen-containing gas supply system similar to the above-described oxygen-containing gas supply system is connected to the gas supply port 304c. A gas dispersion plate that supplies a gas into the process chamber 301 in a shower shape is provided in an outlet (gas discharge port) of the shower head 303s. An exhaust port 331 for exhausting the interior of the process chamber 301 is provided in the process container 303. An exhaust system similar to the exhaust system of the above-described embodiments is connected to the exhaust port 331.

Figure 9B:
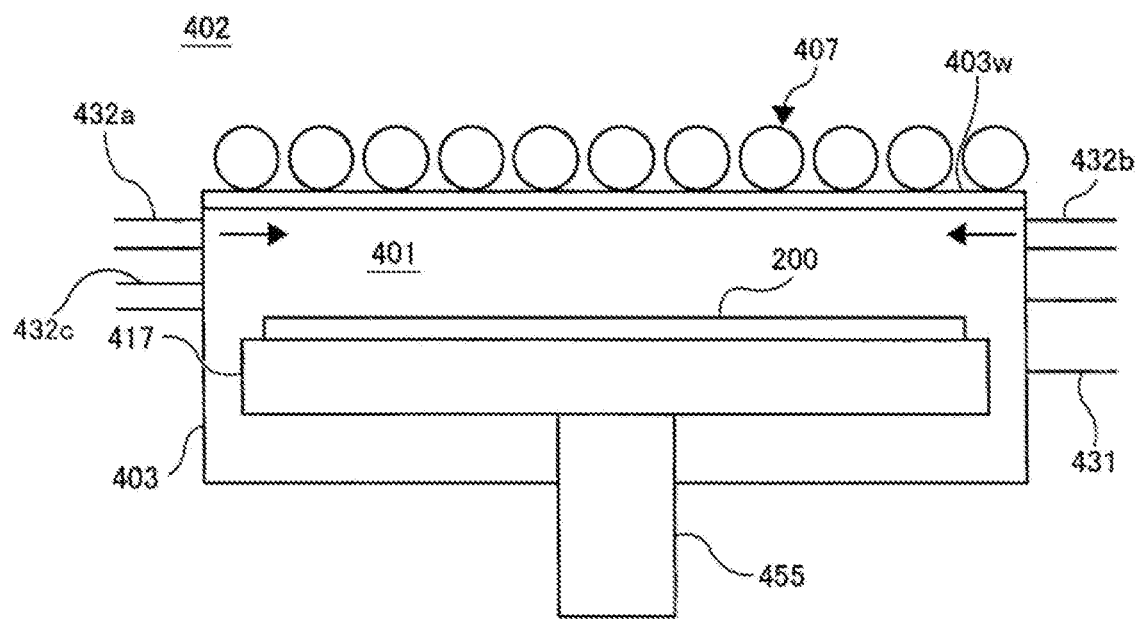

Further, for example, the present disclosure can be suitably applied to even a case where a film is formed by using a substrate processing apparatus including a process furnace 402 shown in FIG. 9B. The process furnace 402 includes a process container 403 forming a process chamber 401, a support 417 that supports one or several wafers 200 in a horizontal posture, a rotary shaft 455 that supports the support 417 from below, a lamp heater 407 that irradiates the wafers 200 of the process container 403 with light, and a quartz window 403w that transmits the light of the lamp heater 407. A gas supply port 432a for supplying the above-described first gas, a gas supply port 432b for supplying the above-described second gas, and a gas supply port 432c for supplying the above-described oxygen-containing gas are connected to the process container 403. A first gas supply system similar to the first gas supply system of the above-described embodiments is connected to the gas supply port 432a. A second gas supply system similar to the second gas supply system of the above-described embodiments is connected to the gas supply port 432b. An oxygen-containing gas supply system similar to the oxygen-containing gas supply system of the above-described embodiment is connected to the gas supply port 432c. An exhaust port 431 for exhausting the interior of the process chamber 401 is provided in the process container 403. An exhaust system similar to the exhaust system of the above-described embodiment is connected to the exhaust port 431.

Even when these substrate processing apparatuses are used, etching can be performed under the same sequence and process conditions as those in the above-described embodiments.

It is desirable that a process recipe (a program in which the processing procedure, process conditions, and the like are written) used for these substrate processing is prepared individually (in plural) according to the substrate processing contents (film type, composition ratio, film quality, film thickness, processing procedure, process conditions, and the like of a thin film to be etched). Then, when starting the substrate processing, it is desirable that a proper process recipe is appropriately selected from a plurality of process recipes according to the substrate processing contents. Specifically, it is desirable that the plurality of process recipes individually prepared according to the substrate processing contents are stored (installed) in advance in the memory 121c included in the substrate processing apparatus via a telecommunication line or a recording medium (the external memory 123) on which the process recipes are recorded. Then, when starting the substrate processing, it is desirable that the CPU 121a included in the substrate processing apparatus appropriately selects a proper process recipe from the plurality of process recipes stored in the memory 121c according to the substrate processing contents. With this configuration, it is possible to form thin films of various film types, composition ratios, film qualities, and film thicknesses with a single substrate processing apparatus in a versatile and well-reproducible manner. Further, it is possible to reduce an operator's operation burden (input burden of processing procedure, process conditions, etc.) and to quickly start the substrate processing while avoiding an operation error.

Further, the present disclosure can also be realized by, for example, changing a process recipe of the existing substrate processing apparatus. When changing a process recipe, the process recipe according to the present disclosure may be installed on the existing substrate processing apparatus via a telecommunications line or a recording medium on which the process recipe is recorded, or it is also possible to change a process recipe of the existing substrate processing apparatus to the process recipe according to the present disclosure by operating an input/output device of the existing substrate processing apparatus.

Although various typical embodiments of the present disclosure have been described above, the present disclosure is not limited to those embodiments, and such embodiments may be used in proper combination.

According to the present disclosure in some embodiments, it is possible to enhance the controllability of etching.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) supplying a first gas containing a group XIV element to the substrate on which a film containing the group XIV element is formed, to thereby:
      generate reaction by-products by reaction with the group XIV element contained in the film,
      dissociate the generated reaction by-products from the substrate to form dissociated reaction by-products, and
      re-adsorb the dissociated reaction by-products on the substrate;
   (b) supplying a second gas containing a halogen after (a); and
   (c) etching the film containing the group XIV element formed on the substrate by alternately repeating (a) and (b).

2. The method of claim 1, wherein in (a), the first gas is supplied in an atmosphere in which the first gas is decomposed.

3. The method of claim 1, wherein in (b), the second gas is supplied in an atmosphere in which the second gas is not decomposed.

4. The method of claim 1, further comprising: (d) in (c), purging an interior of a process container in which the substrate is arranged after (b).

5. The method of claim 1, further comprising: (d) in (c), not purging an interior of a process container in which the substrate is arranged after (b).

6. The method of claim 1, wherein purging is not performed between (a) and (b).

7. The method of claim 1, wherein the group XIV element is silicon, and
   wherein the first gas is a silane-based gas or a chlorosilane-based gas.

8. The method of claim 1, wherein the group XIV element is silicon, and
   wherein the first gas is a chlorosilane-based gas.

9. The method of claim 8, wherein the chlorosilane-based gas is a gas containing at least one or more selected from the group of dichlorosilane, hexachlorodisilane, and silicon tetrachloride.

10. The method of claim 1, wherein the halogen is a gas containing chlorine.

11. The method of claim 10, wherein the second gas is at least one or more selected from the group of a chlorine gas, a hydrogen chloride gas, a boron trichloride gas, a silicon tetrachloride gas, and a mixture of a monosilane gas and a chlorine gas.

12. The method of claim 1, wherein the film containing the group XIV element is a film containing silicon as a main component.

13. The method of claim 1, wherein a first silicon film doped with a predetermined element and a second silicon film not doped with the predetermined element are formed on a surface of the substrate, and
    wherein in (c), the second silicon film not doped with the predetermined element is etched.

14. The method of claim 1, wherein a crystalline silicon film and a non-crystalline silicon film are formed on a surface of the substrate, and
    wherein in (c), both the crystalline silicon film and the non-crystalline silicon film are etched.

15. The method of claim 1, wherein an oxide film and a non-oxide film are formed on a surface of the substrate, and
    wherein in (c), the non-oxide film is etched.

16. The method of claim 1, wherein a nitride film and a non-nitride film are formed on a surface of the substrate, and
    wherein in (c), the non-nitride film is etched.

17. The method of claim 1, further comprising: (d) supplying an oxygen-containing gas in the middle of (c).

18. A substrate processing apparatus comprising:
    a gas supply system configured to supply a first gas containing a group XIV element and a second gas containing a halogen to a substrate on which a film containing the group XIV element is formed, in a process container; and
    a controller configured to be capable of controlling the gas supply system so as to perform a process including:
    (a) supplying the first gas to the substrate, to thereby:
    generate reaction by-products by reaction with the group XIV element contained in the film;
    dissociate the generated reaction by-products from the substrate; and
    re-adsorb the dissociated reaction by-products on the substrate;
    (b) supplying the second gas to the substrate after (a); and
    (c) etching the film containing the group XIV element formed on the substrate by alternately repeating (a) and (b).

19. A non-transitory computer-readable recording medium storing a program that causes, by a computer, a substrate processing apparatus to perform a process comprising:
    (a) supplying a first gas containing a group XIV element to a substrate on which a film containing the group XIV element is formed, to thereby:

generate reaction by-products by reaction with the group XIV element contained in the film;
dissociate the generated reaction by-products from the substrate; and
re-adsorb the dissociated reaction by-products on the substrate;
(b) supplying a second gas containing a halogen after (a); and
(c) etching the film containing the group XIV element formed on the substrate by alternately repeating (a) and (b).

20. A method of manufacturing a semiconductor device, comprising performing the method of claim 1 one the substrate.

* * * * *